(12) United States Patent
Kishimoto

(10) Patent No.: US 6,700,061 B2
(45) Date of Patent: Mar. 2, 2004

(54) COMPOSITE ELECTRONIC COMPONENT

(75) Inventor: Yasunori Kishimoto, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/962,178

(22) Filed: Sep. 25, 2001

(65) Prior Publication Data

US 2002/0043899 A1 Apr. 18, 2002

(30) Foreign Application Priority Data

Oct. 17, 2000 (JP) ........................................ 2000-316963

(51) Int. Cl.[7] ............................................. H01L 23/02
(52) U.S. Cl. .................... 174/52.4; 174/11 R; 174/260; 174/262
(58) Field of Search .............................. 174/52.4, 11 R, 174/260, 262

(56) References Cited

U.S. PATENT DOCUMENTS

| 4,792,939 | A | * | 12/1988 | Hikita et al. | 370/277 |
| 5,903,820 | A | * | 5/1999 | Hagstrom | 455/82 |
| 6,115,592 | A | * | 9/2000 | Ueda et al. | 455/307 |
| 6,285,559 | B1 | * | 9/2001 | Fukiharu | 361/760 |

FOREIGN PATENT DOCUMENTS

| JP | 9-181567 | 7/1997 |
| JP | 2000-49565 | 2/2000 |
| JP | 2000-77604 | 3/2000 |
| JP | 2001-352272 | 12/2001 |

* cited by examiner

Primary Examiner—Dean A. Reichard
Assistant Examiner—Jinhee J. Lee
(74) Attorney, Agent, or Firm—Keating & Bennett, LLP

(57) ABSTRACT

A composite electronic component that prevents the electrical connection between a conductive case member of the composite electronic component, which performs physical shielding against a physical impact or dust adhesion and also performs an electromagnetic shielding function, and a conductive member for performing the electromagnetic shielding function for a surface acoustic wave element built therein. A composite electronic component includes surface acoustic wave devices therein, a first case member, and a second metallic case member. In order to prevent the electrical connection between the internal surface of the metallic case connected to a ground potential and a conductor disposed in a package of the surface acoustic wave devices and connected to the ground potential to perform the electromagnetic shielding function, an insulating material layer is provided on at least one of the top surface of the conductor and the bottom surface of a top plate of the metallic case.

29 Claims, 16 Drawing Sheets

COMPOSITE ELECTRONIC COMPONENT

BACKGROUND OF THE INVENTION

1. Field of the Invention

The present invention relates to composite electronic components defining duplexers for use in portable telephones, for example, and in particular relates to a composite electronic component including a surface acoustic wave device that has a package structure having an electromagnetic shielding effect.

2. Description of the Related Art

The size and weight of mobile and cellular telephones have recently been reduced, and electronic components used therein also have been miniaturized, reduced in height, and combined. When the combination and high-packaging density of electronic components are promoted, signal interference is likely to arise within the device. Therefore, the prevention of signal interference is an important aspect in an electronic component and a composite electronic component formed by combining a plurality of electronic components.

To prevent signal interference, various measures have been taken. FIG. 16 is a schematic sectional view illustrating a surface acoustic wave filter as an example of a conventional surface acoustic wave device. In a surface acoustic wave filter 101, a surface acoustic wave element 103 is accommodated within a package 102. The package 102 includes a package body 104 and a lid 105. The package body 104 is formed of an insulating ceramic such as alumina. The package body 104 is provided with a plurality of electrodes that are connected to the surface acoustic wave element 103, and via bonding wires 106 and 107, the surface acoustic wave element 103 and these electrodes are electrically connected together.

In the plurality of electrodes provided in the package body 104, an electrode 108 is connected to the ground electric potential, and a terminal to be connected to the ground electric potential of the surface acoustic wave element 103 is connected to the electrode 108 via a bonding wire.

The lid 105 made of a metal protects the surface acoustic wave element 103 accommodated in the inside from external electromagnetic waves. The lid 105 is electrically connected to an electrode to be connected to the ground electric potential of the surface acoustic wave element 103 and an electrode of the package body 104, such that noises from the outside of the package are prevented from entering therein. Such a structure is disclosed in Japanese Unexamined Patent Application Publication No. 12-049565, for example.

In a composite electronic component including the surface acoustic wave device described above, similar measures have also taken. For example, in Japanese Unexamined Patent Application Publication No. 9-181567, a duplexer is schematically shown in FIG. 17. In the drawing, on a planar case circuit board 121, surface acoustic wave devices 122 and 123, capacitors 124 and 125, and a coil 126 are mounted. A metallic cover member 127 is provided on the case circuit board 121 and is fixed thereto so as to surround these elements.

In addition, although the surface acoustic wave devices 122 and 123 are schematically shown, the top surface thereof is made of a conductive material to provide an electromagnetic shielding effect similar to the surface acoustic wave device 101 described above.

In the duplexer, due to the package structure of the surface acoustic wave devices 122 and 123, a surface acoustic wave element is shielded against electromagnetic noises, and moreover, noises from the outside are prevented from entering therein by the metallic cover member 127.

In a mobile or cellular telephone, the product is constructed by combining a plurality of electronic circuit blocks that perform different functions. FIG. 18 is a circuit block diagram of a mobile or cellular telephone.

As is apparent from FIG. 18, high-frequency signals from a base station are received by an antenna 131 and are converted into IF signals by a duplexer 132 via receiving components 133 to 137. In contrast, IF transmitting signals produced in the terminal are output to the antenna 131 via the duplexer 132 after passing through transmitting components 138 to 142.

In this case, in a receiving system which handles weak signals, an RF receiving block 143 for filtering and amplifying high-frequency signals and an IF receiving block 144 for filtering and amplifying IF signals are shielded against external noises by covering the respective entire blocks with conductive cover members having the ground potential.

By connecting the conductive cover member mentioned above to the ground potential, not only is the electromagnetically shielding provided as described above, but also the ground potential in a composite electronic component is reinforced.

As described above, by connecting the lid of the surface acoustic wave device package to the ground potential, external noises are prevented from entering the package. Likewise, in a composite electronic component such as a duplexer, by connecting the conductive cover member to the ground potential, external noises are prevented from entering the composite electronic component and the ground potential is reinforced.

On the other hand, in a surface acoustic wave device such as a ladder type filter having a parallel arm resonator and a series arm resonator, large changes in characteristics due to an inductance component existing between the parallel-arm resonator and the ground potential are present. In the surface acoustic wave device, the inductance component is produced in a bonding wire for achieving the connection between an electrode which is connected to the ground potential and an electrode pad on a surface acoustic wave element which is connected to the ground potential, a via hole electrode in the package, or a wiring pattern.

Furthermore, in a composite electronic component having a surface acoustic wave device mounted thereon, various inductance components are provided to allow signals to pass through, such as a via hole electrode provided on a case circuit board and a patterned conductive pattern.

Therefore, the resultant total inductances existing between the parallel arm resonator and the ground potential greatly effect the characteristics of the surface acoustic wave device and the composite electronic component using the surface acoustic wave device.

Reduction in the height of an electronic component to be mounted is necessary with the miniaturization and reduction in thickness of a mobile or cellular telephone. Therefore, due to a physical impact and stress applied to a mobile or cellular telephone and conductive floating substances, such as solder scraps and dust, the conductive member providing electromagnetic shielding may come into contact with the conductive cover member of the composite electronic component in the package of the surface acoustic wave device. Accordingly, when these members come into contact, the parasitic inductance component is changed, resulting in deterioration in characteristics of the surface acoustic wave device.

That is, in a composite electronic component having a surface acoustic wave device built therein with a ladder-type circuit structure shown in FIG. 19, for example, there are inductances L1 to L3 generated by bonding wires in the surface acoustic wave device, an inductance L4 generated by wiring or a through-hole electrode in the package of the surface acoustic wave device, and an inductance L5 generated by wiring disposed in a case of the composite electronic component. In addition, in FIG. 19, numeral P1 denotes a ground terminal of the surface acoustic wave device package. When a conductive member providing electromagnetic shielding comes in contact with a conductive cover member of the composite electronic component so as to be connected, a connecting route shown in a dotted line X is formed. Therefore, the inductance between the parallel arm resonator in the surface acoustic wave device and the ground potential is changed, resulting in deteriorating in characteristics as mentioned above.

In addition, not only in a surface acoustic wave device with a ladder-type circuit structure having a parallel arm resonator, but also in a surface acoustic wave device with another structure, deterioration in characteristics may be produced by changes in the inductance component due to a signal route in the surface acoustic wave device and a signal route in the composite electronic component.

SUMMARY OF THE INVENTION

To overcome the above-described problems, preferred embodiments of the present invention provide a composite electronic component that securely prevents the occurrence of an electrical connection, which is caused by physical impact and dust adhesion, between a conductive case member of the composite electronic component providing physical and electromagnetic shielding and a conductive member of a surface acoustic wave device disposed therein that provides electromagnetic shielding.

In addition, preferred embodiments of the present invention provide a composite electronic component in which the characteristics are not deteriorated due to changes in the parasitic inductance component generated between a surface acoustic wave device and the ground potential.

Also, preferred embodiments of the present invention provide a composite electronic component having a conductive cover member to be connected to the ground potential for providing the electromagnetic shielding function and reinforcing the ground potential function of the conductive cover member.

In accordance with a first preferred embodiment of the present invention, a composite electronic component, having a surface acoustic wave device disposed therein, includes a first case member, a package, a surface acoustic wave element mounted on the first case member and accommodated within the package, and a ground terminal, the package being connected to the surface acoustic wave device having a conductor in at least one portion thereof and to the first case member, and a conductive second case member connected to the ground potential, wherein at least one of the external surface of the conductor and the internal surface of the second case member is provided with an insulating material layer disposed in an opposing portion between the external surface of the conductor of the package and the internal surface of the second case member.

In a specific example of the first preferred embodiment, the insulating material layer is preferably provided on the external surface of the conductor of the package.

In an alternative specific example of the first preferred embodiment, the insulating material layer is preferably provided on the internal surface of the second case member.

In accordance with a second preferred embodiment of the present invention, a composite electronic component, having a surface acoustic wave device disposed therein, includes a first case member, a package, a surface acoustic wave element mounted on the first case member and accommodated within the package, and a ground terminal, the package being connected to the surface acoustic wave device having a conductor in at least one portion thereof and to the first case member, and a conductive second case member connected to the ground potential, the conductive second case member having an opening in a portion opposing the conductor of the package.

In a specific example of the first and the second preferred embodiments, the first case member is preferably a planar case circuit board and the second case member preferably includes a top plate and an annular side-wall extending downwardly from the periphery of the top plate to surround the surface acoustic wave device mounted on the planar first case member.

In another example of preferred embodiments of the present invention, the second case member is made of a metal.

In another specific example of preferred embodiments of the present invention, the second case member is defined by an insulator and a conductive film provided on the external surface of the insulator.

In another specific example of preferred embodiments of the present invention, the package includes a first package member and a second package member, the surface acoustic wave element being mounted on the first package member and the second package member including the conductor.

In another specific example of preferred embodiments of the present invention, the first package member includes a bottom plate and an annular side—wall extending upwardly from the periphery of the bottom plate so as to form an upward opening and the second package member defined by a planar lid fixed so as to close the opening of the first package.

In another specific example of preferred embodiments of the present invention, the first package member is a planar package circuit board and the second package member includes a top plate and an annular side-wall extending downwardly from the periphery of the top plate to surround the surface acoustic wave element mounted on the planar package circuit board.

In another specific example of preferred embodiments of the present invention, the second package member includes a metallic cap.

In another specific example of preferred embodiments of the present invention, a plurality of the surface acoustic wave devices is mounted on the first case member.

In another specific example of preferred embodiments of the present invention, the surface acoustic wave device may include a plurality of surface acoustic wave elements.

In another specific example of preferred embodiments of the present invention, each of the plurality of surface acoustic wave elements may have a ladder-type circuit configuration including a series arm resonator and a parallel arm resonator.

In another specific example of preferred embodiments of the present invention, a communication device including a composite electronic component according to other preferred embodiments of the present invention is provided.

In a composite electronic component according to the first preferred embodiment of the present invention, because at least one of an external surface of a conductor of a package and an internal surface of a second case member is provided with an insulating material layer provided in an opposing portion between the external surface of the conductor and the internal surface of the second case member, even when an external force is applied or solder scraps or conductive dust are adhered thereto, an electrical connection between the external surface of the conductor and the internal surface of the second case member is prevented by the insulating material layer. Accordingly, a reliable composite electronic component having stable characteristics that do not deteriorate is provided. Also, the second case member provides greatly improved shielding effects.

In a composite electronic component according to the second preferred embodiment of the present invention, a surface acoustic wave device is mounted on a first case member while in a second case member fixed to the first case member, an opening is provided in a portion opposing a conductor of a package of the surface acoustic wave device to surround the surface acoustic wave device. Therefore, as in the first preferred embodiment, even when an external force is applied or solder scraps or conductive dust are adhered thereto, the electrical connection between the second case member and the conductor of the package of the surface acoustic wave device is prevented. Accordingly, a reliable composite electronic component with stable characteristics is provided.

Other features, elements, characteristics and advantages of the present invention will become more apparent from the following detailed description of the preferred embodiments with reference to the attached drawings.

DETAILED DESCRIPTION OF PREFERRED EMBODIMENTS

The present invention will be described in accordance with specific preferred embodiments of the present invention, referring to drawings.

Figure 1:
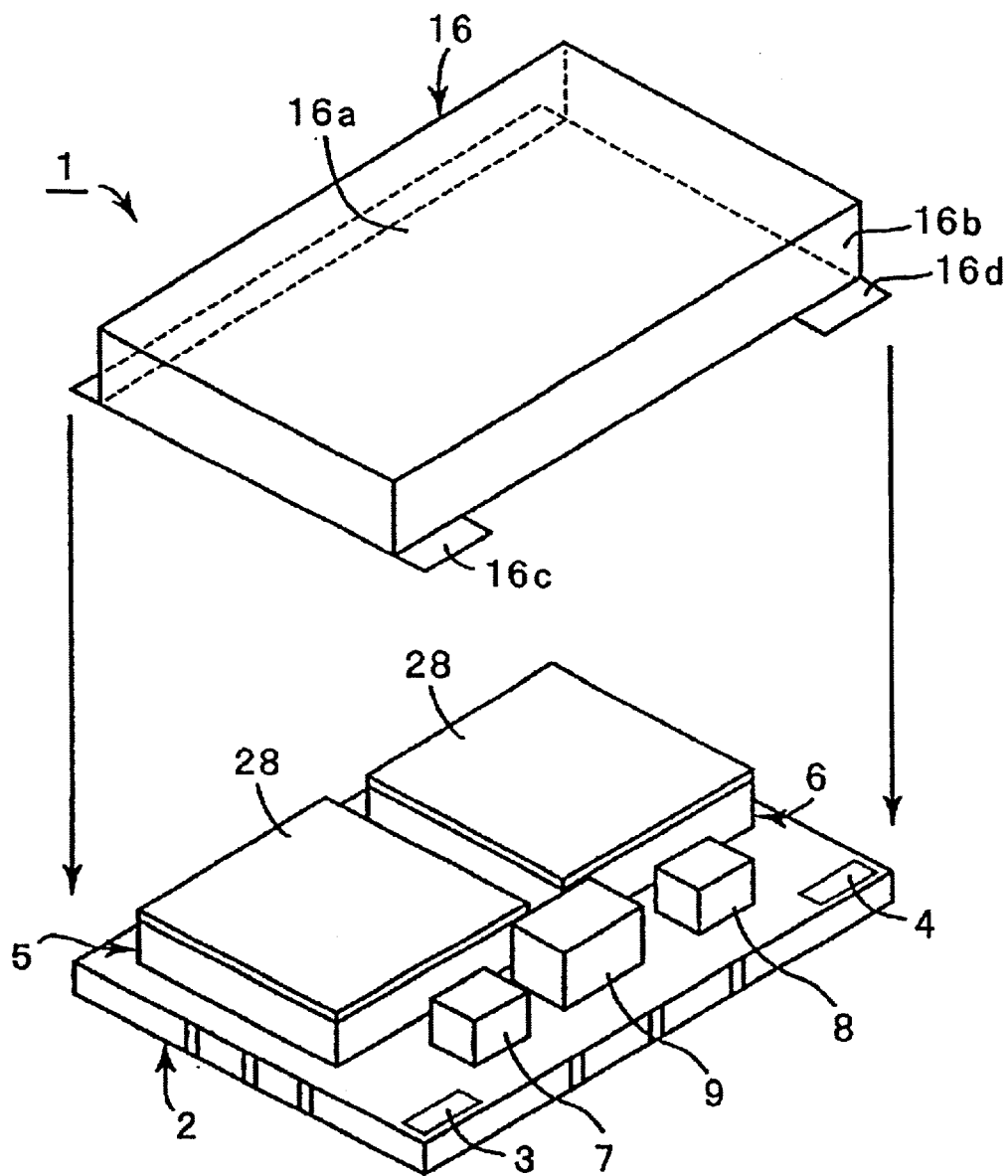
FIG. 1 is an assembly view of a duplexer as a composite electronic component according to a first preferred embodiment of the present invention.

FIG. 1 is an assembly view of a duplexer as a composite electronic component according to a first preferred embodiment of the present invention.

A duplexer 1 has a planar case circuit board 2 as a first case member. The case circuit board 2 is made of a conventional insulating circuit board such as a glass-fiber-reinforced epoxy printed circuit board and an alumina circuit board. On the top surface of the case circuit board 2, a plurality of electrodes including electrodes 3 and 4 are provided.

Figure 2:
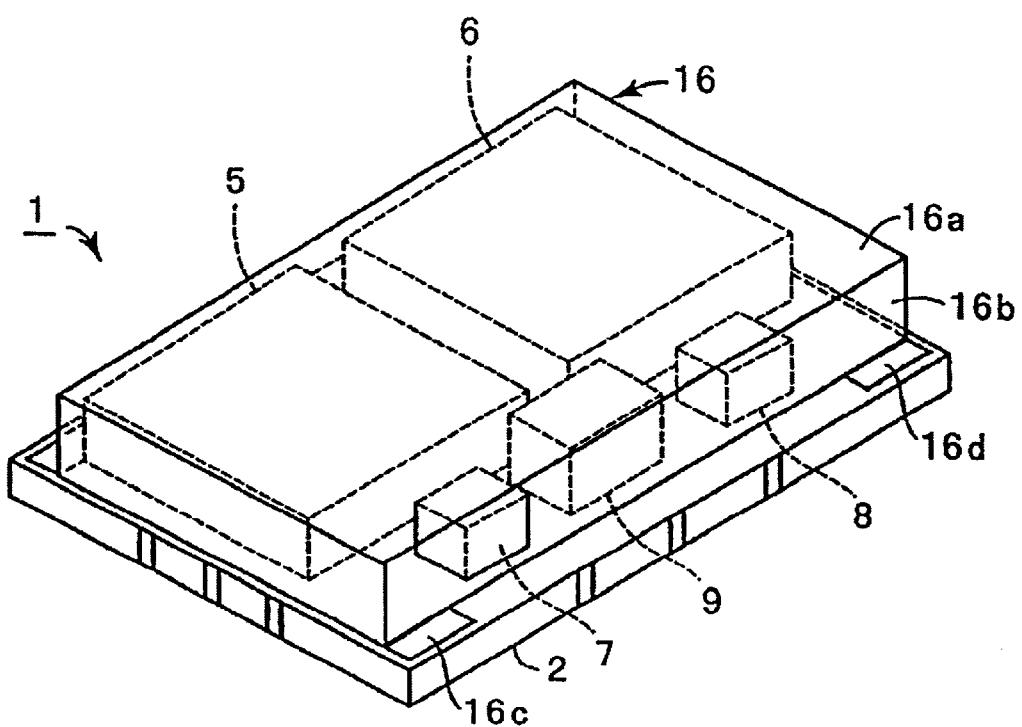
FIG. 2 is a perspective view of the duplexer shown in FIG. 1.
Figure 3:
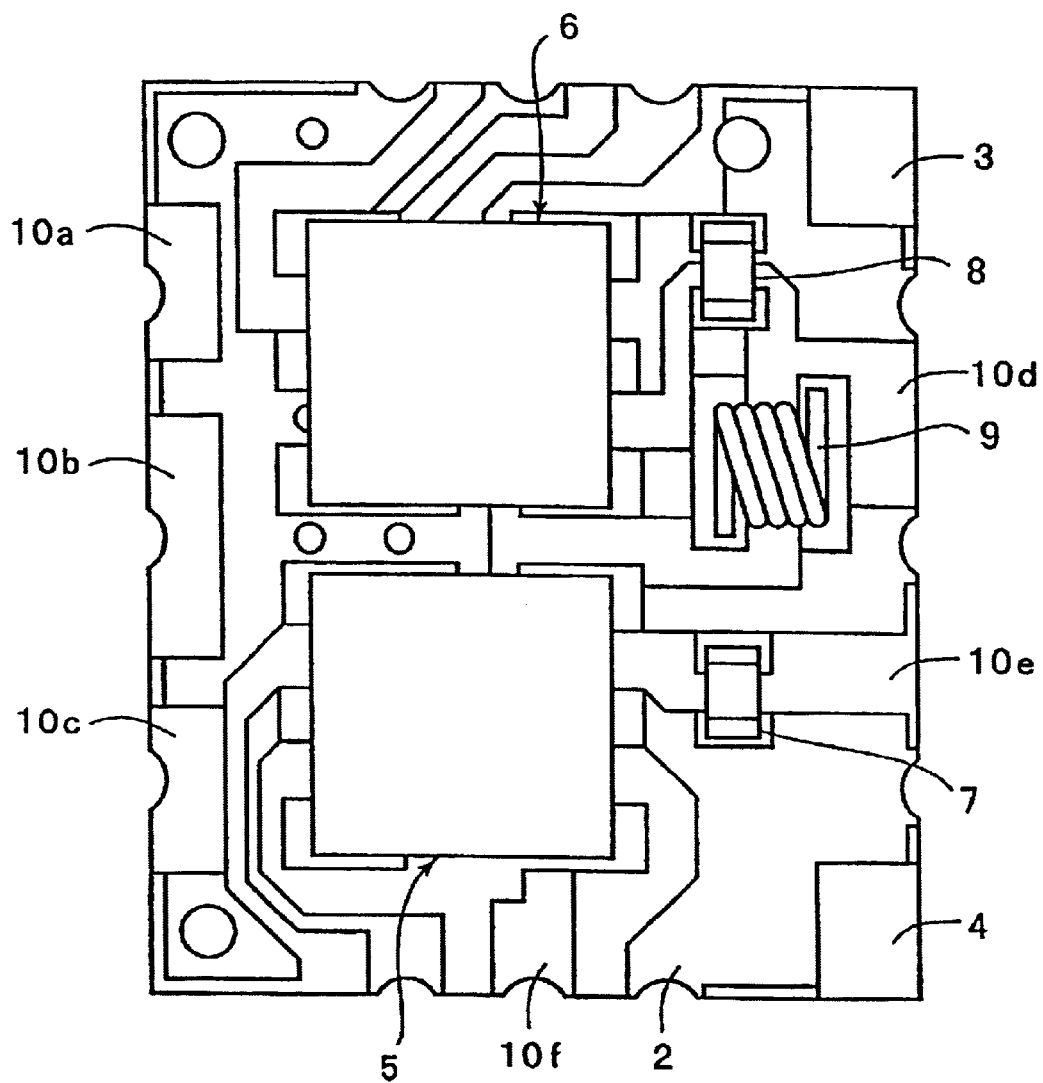
FIG. 3 is a plan view for illustrating a case circuit board, a surface acoustic wave device mounted on the case circuit board, a coil, and a capacitor used in the duplexer according to the first preferred embodiment of the present invention.

On the top surface of the case circuit board 2, capacitors 7 and 8, a coil 9, and surface acoustic wave devices 5 and 6 are provided. The capacitors 7 and 8 and the coil 9 are schematically shown in FIGS. 1 and 2, and each preferably has a planar configuration as shown in FIG. 3.

According to the present preferred embodiment, the capacitors 7 and 8 are monolithic capacitors, however, another type of capacitor may be used. Also, another inductance component such as a monolithic inductor may be used instead of the coil 9.

Figure 7:
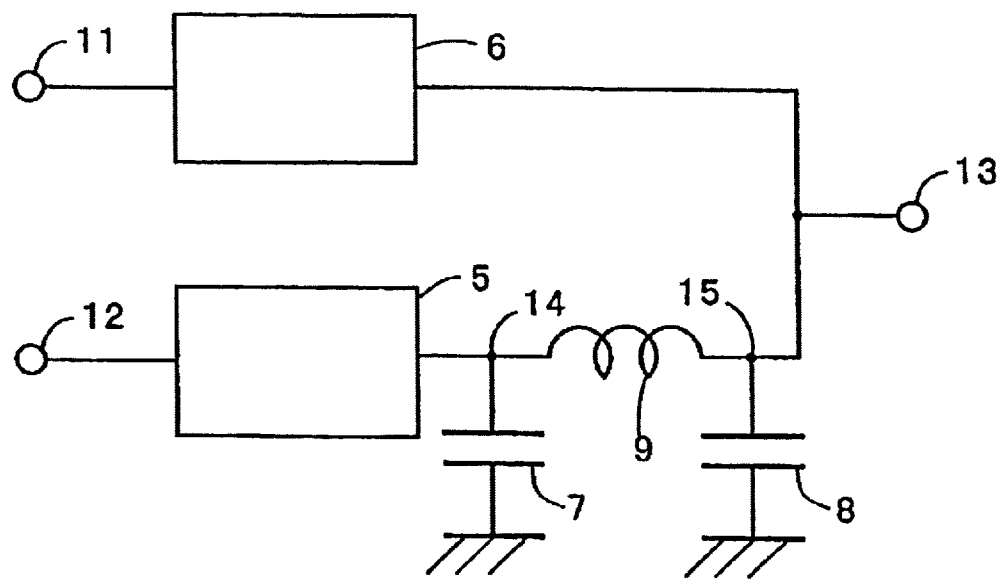
FIG. 7 is a diagram for illustrating a circuit configuration of the duplexer according to the first preferred embodiment of the present invention.

The circuit of the duplexer according to the present preferred embodiment is shown in FIG. 7.

Between an input terminal (Tx terminal) 11 of transmitting signals and an input-output terminal (ANT terminal) 13 that is connected to an antenna, a surface acoustic wave device 6 having passing characteristics in a transmitting frequency band is connected. Likewise, between a receiving terminal (Rx terminal) 12 for receiving signals and the ANT terminal 13, a surface acoustic wave device 5 having passing characteristics at a receiving frequency band is connected. Also, between the ANT terminal 13 and the surface acoustic wave device 5, the coil 9 and the capacitors 7 and 8 are connected as shown in FIG. 7.

The circuit of the duplexer shown in FIG. 7 is preferably the same as that of a conventional duplexer used for mobile or cellular telephones. The surface acoustic wave devices 5 and 6, the capacitors 7 and 8, and the coil 9 are electrically connected to each other on the case circuit board 2 to produce the circuit shown in FIG. 7.

As shown in FIGS. 1 and 2, a metallic second case member 16 is fixed on the top surface of the case circuit board 2 so as to surround the surface acoustic wave devices 5 and 6, the capacitors 7 and 8, and the coil 9. The metallic case 16 preferably includes a top plate 16a and an annular side-wall 16b extending downwardly from the outer periphery of the top plate 16a. Tongue pieces 16c and 16d protruding in the horizontal direction are provided on the longer side of the annular side-wall 16b. The tongue pieces 16c and 16d are respectively joined and electrically connected to electrodes 3 and 4 provided on the top surface of the case circuit board 2. The electrodes 3 and 4 disposed on the case circuit board 2 are connected to the ground potential.

That is, the metallic case 16 is electrically connected to the ground potential via the electrodes 3 and 4.

Next, the surface acoustic wave devices 5 and 6 will be described in detail with reference to FIGS. 4 to 6. Since the surface acoustic wave devices 5 and 6 have the same structure, only the surface acoustic wave device 5 will be described.

Figure 4:
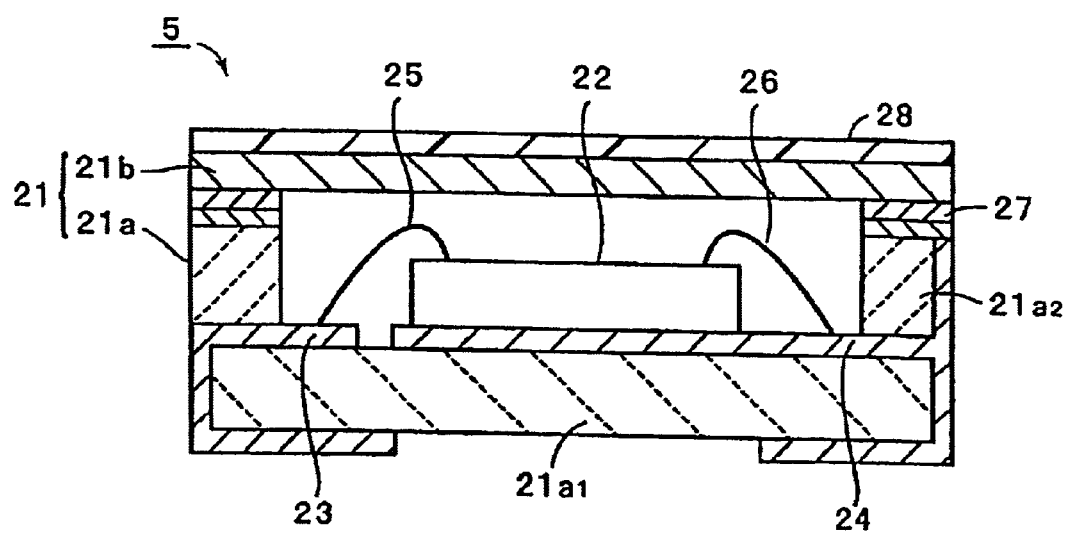
FIG. 4 is a sectional view of the surface acoustic wave device used in the first preferred embodiment of the present invention.

As shown in FIG. 4, in the surface acoustic wave device 5, a surface acoustic wave element chip 22 is provided in a package 21. The package 21 preferably includes a first package member 21a and a lid 21b defining a second package member. The first package member 21a includes a bottom plate $21a_1$ and an annular side-wall $21a_2$ extending upwardly on sides of the bottom plate $21a_1$. On the bottom plate $21a_1$ of the first package member 21a, the surface acoustic wave element chip 22 is mounted.

Although schematically shown in FIG. 4, on the first package member 21a, a plurality of electrodes 23 and 24 are provided, which are electrically connected to electrode pads provided on the surface acoustic wave element chip 22 with bonding wires 25 and 26.

The metallic lid 21b defining the planar second package member is joined to the first package member 21a with a conductive adhesive 27 so as to close the upper opening of the first package member 21a.

The first package member 21a is preferably made of an insulating ceramic, such as alumina, and is produced by integrally firing the first package member 21a with the electrodes 23 and 24 mentioned above.

The lid 21b is preferably made of an appropriate metal, such as aluminum and stainless steel, and provides electromagnetic shielding for the surface acoustic wave element chip 22 accommodated therein.

The surface acoustic wave element chip 22 having an insulating material layer 28 provided thereon according to the present preferred embodiment will be described in detail with reference to FIGS. 5 and 6.

The surface acoustic wave element chip 22 includes a piezoelectric circuit board 31. On the piezoelectric circuit board 31, plural IDTs 32 to 38 are provided. Surface acoustic wave resonators are defined by the plural IDTs 32 to 38, respectively. The surface acoustic wave resonators 32 to 38 are electrically connected to each other to produce the circuit shown in FIG. 6. That is, the resonators 32 to 38 are electrically connected to each other to define a ladder-type circuit as a whole, in which the surface acoustic wave resonators 32, 35, and 38 define parallel arm resonators and the surface acoustic wave resonators 33, 34, 36, and 37 define series arm resonators.

Figure 5:
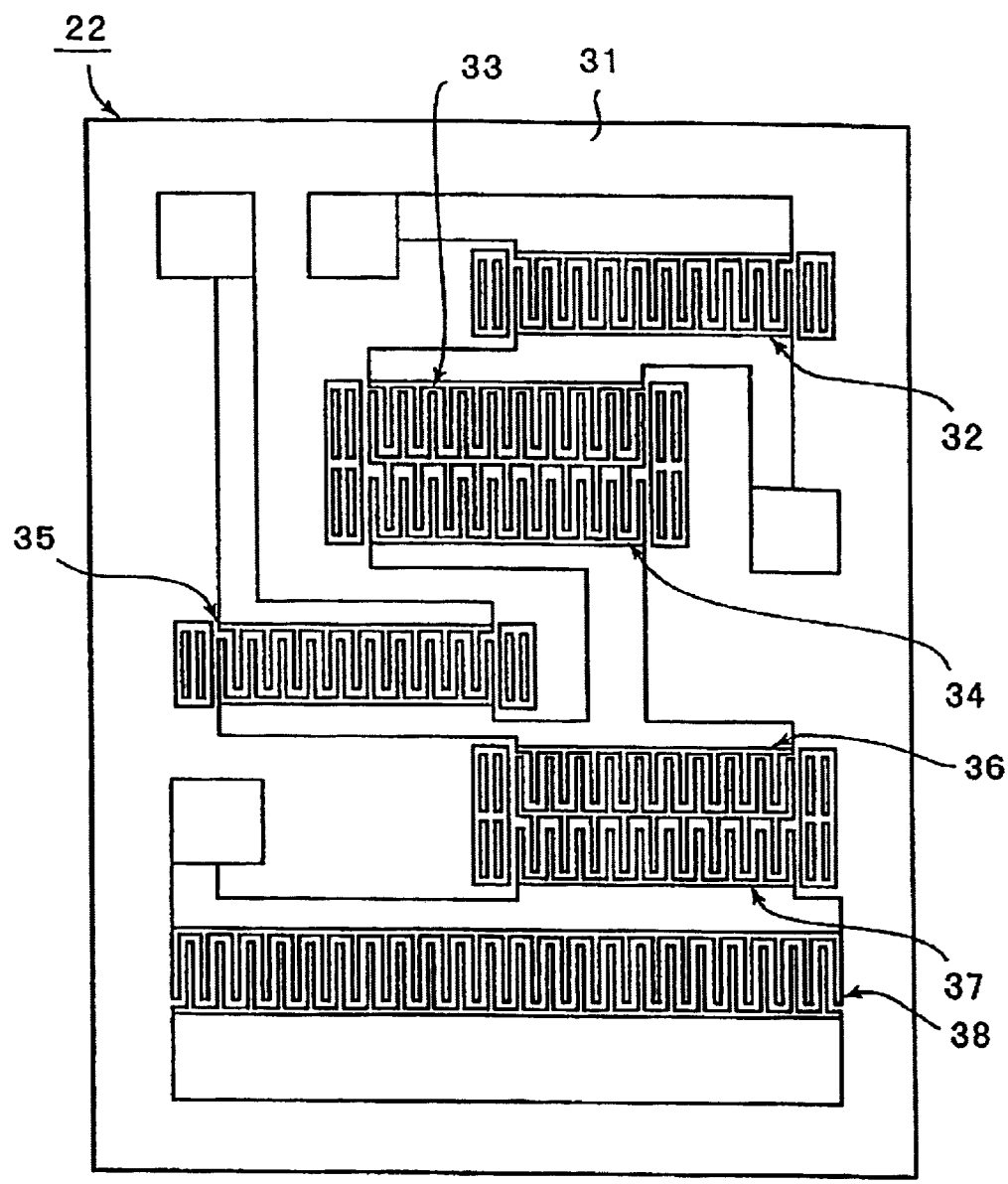
FIG. 5 is a plan view of a surface acoustic wave element chip used in the surface acoustic wave device shown in FIG. 4.
Figure 6:
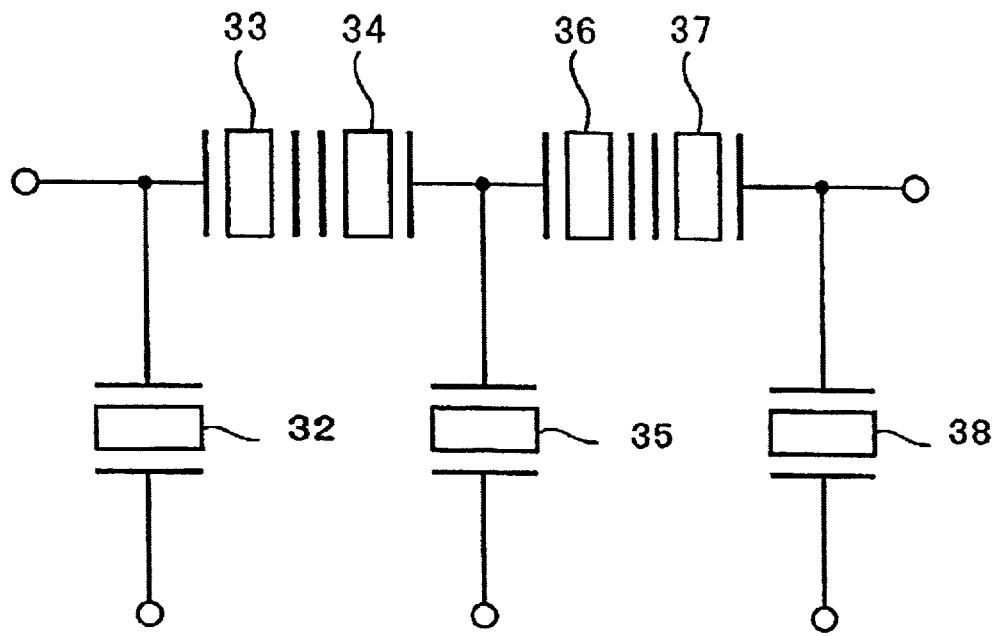
FIG. 6 is a circuit diagram for illustrating a circuit configuration defined by the surface acoustic wave element chip shown in FIG. 5.

In addition, although FIG. 4 illustrates only two bonding wires 25 and 26, electrode pads on the surface acoustic wave element chip 22 shown in FIG. 5 are connected to electrodes provided on the first package member 21a with bonding wires, respectively.

That is, the surface acoustic wave device 5 includes a plurality of surface acoustic wave resonators disposed therein.

However, according to various preferred embodiments of the present invention, each of surface acoustic wave devices 5 and 6 may have only one surface acoustic wave resonator built therein, or may have one or more surface acoustic wave resonators built therein.

Since the surface acoustic wave device 6 is the same as the surface acoustic wave device 5 in structure, a detailed description thereof is omitted.

Referring to FIG. 1 again, the duplexer 1 according to the present preferred embodiment includes the insulating material layers 28 provided on the top surfaces of the surface acoustic wave devices 5 and 6, respectively. The insulating material layer 28 according to the present preferred embodiment is preferably formed of an insulating tape. The insulating tape includes an adhesive layer provided on one side of the insulating tape. However, the insulating material layer 28 may be formed by coating a synthetic resin or an insulating paint on the top surface of the lid 21b of each of the surface acoustic wave devices 5 and 6.

In any case, in one portion of the external surface of the package of the respective surface acoustic wave devices 5 and 6, which is the portion opposing the metallic case 16 as the first case member, which is the top surface of the lid 21b according to the present preferred embodiment, the insulating material layer 28 is disposed.

Accordingly, even when the internal surface of the top plate 16a of the metallic case 16 is caused to contact with the top surface of the respective surface acoustic wave devices 5 and 6 by an external force, or solder scraps or conductive dust existing between them, an electrical connection between the metallic case 16 and the lid 16b is reliably prevented by the insulating material layer 28.

In the duplexer 1 according to the present preferred embodiment, since the electrical connection due to an external force, or solder scraps or conductive dust is securely prevented, deterioration in characteristics due to the connection is reliably prevented. These advantages will be described based on experimental results.

Figure 8:
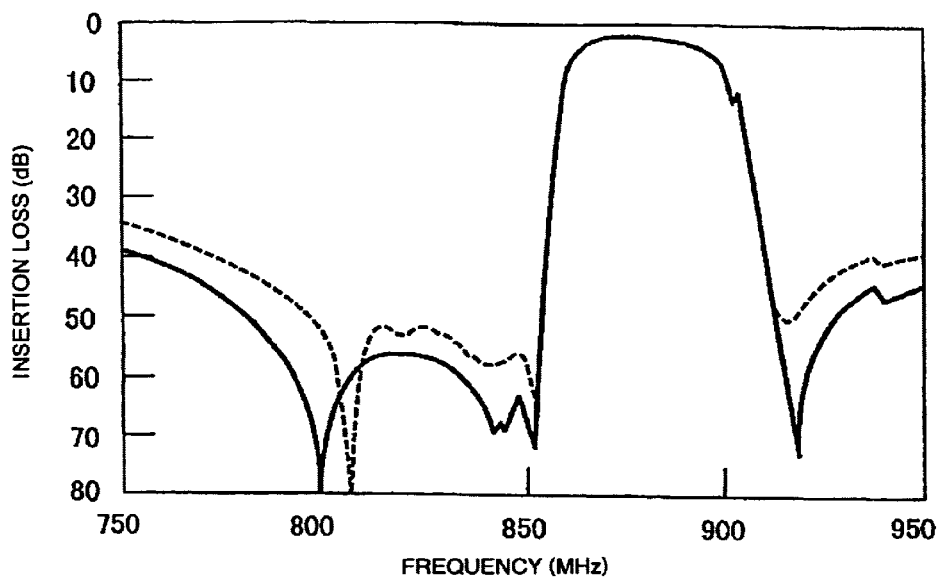
FIG. 8 is a graph for showing frequency characteristics of the duplexer according to the first preferred embodiment and a duplexer prepared for a comparative example.
Figure 9:
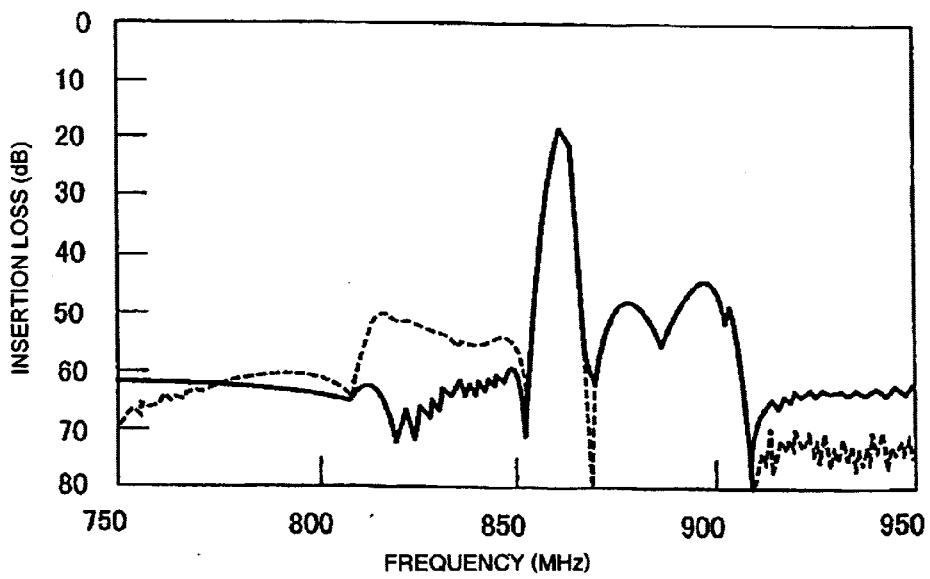
FIG. 9 is a graph for showing isolation characteristics of the duplexer according to the first preferred embodiment and the duplexer prepared for the comparative example.

FIG. 8 shows passing characteristics from the ANT terminal to the Rx terminal of the duplexer 1 according to the present preferred embodiment of the present invention. FIG. 9 shows isolation characteristics of the duplexer 1. The solid lines in FIGS. 8 and 9 indicate the characteristics according to the present preferred embodiment, and the broken lines indicate the characteristics of a comparative example in that the lid 21b is brought into contact with the internal surface of the metallic case 16 without providing the insulating material layer 28 of the surface acoustic wave device 5. In addition, in the present preferred embodiment, the transmitting band is preferably about 824 MHz to about 849 MHz and the receiving band is preferably about 869 MHz to about 894 MHz.

As is apparent from FIGS. 8 and 9, when the internal surface of the metallic case 16 is electrically connected to the lid 21b of the surface acoustic wave device 5, the attenuation at the transmitting band is reduced by approximately 4 dB while the isolation at the same band is deteriorated by approximately 10 dB. This is because the inductance component between the parallel arm resonator of the surface acoustic wave device 5 and the ground potential is changed due to the electrical connection.

In contrast, when the insulating material layer 28 is provided as in the preferred embodiment, because the electrical connection between the metallic case 16 and the lid 21b is prevented, the characteristics indicated by solid lines in FIGS. 8 and 9 are maintained. That is, even when the internal surface of the metallic case 16 is caused to contact with the top surface of the insulating material layer 28 by an external force, or solder scraps or conductive dust existing between them, because the electrical connection is prevented, the desired characteristics are stably maintained.

Furthermore, the metallic case 16 is maintained at the ground potential, such that the electromagnetic shielding effect is sufficiently exhibited. Therefore, the insulating material layer 28 reduces the distance between the top plate 16a of the metallic case 16 and the top surfaces of the surface acoustic wave devices 5 and 6, resulting in reduction in height of the duplexer.

Figure 10:
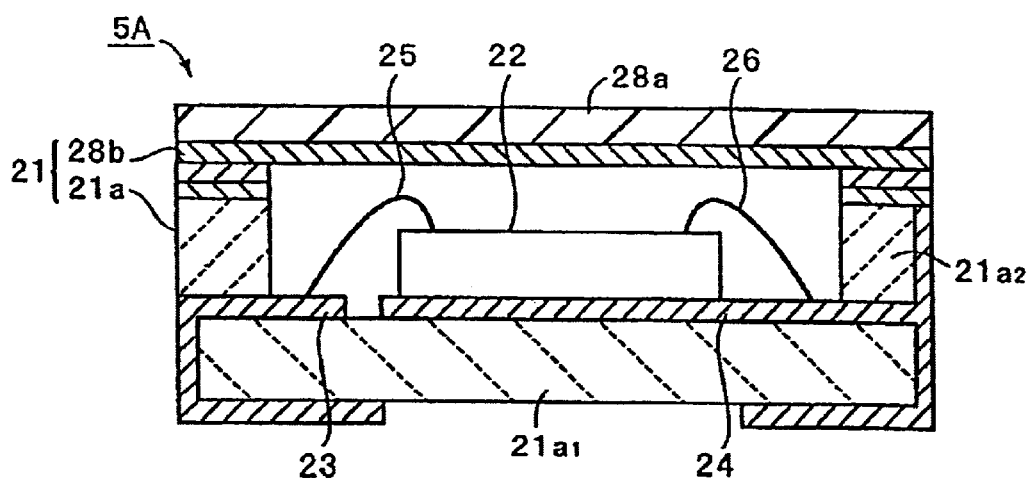
FIG. 10 is a sectional view of a surface acoustic wave device according to a first modification of the first preferred embodiment of the present invention.

FIG. 10 is a sectional view of a first modification of the above-described preferred embodiments of the surface acoustic wave device 5. In the surface acoustic wave device 5, the insulating material layer 28 is provided on the top surface of the lid 21b made of a metallic plate, as shown in FIG. 4.

On the other hand, in the modified surface acoustic wave device 5A shown in FIG. 10, a metallized layer 28b is provided on the bottom surface of an insulating plate 28a, such as a synthetic resin plate. That is, the metallized layer 28b performs the electromagnetic shielding function as a conductor and the insulating plate 28a is an insulating material layer.

Figure 11:
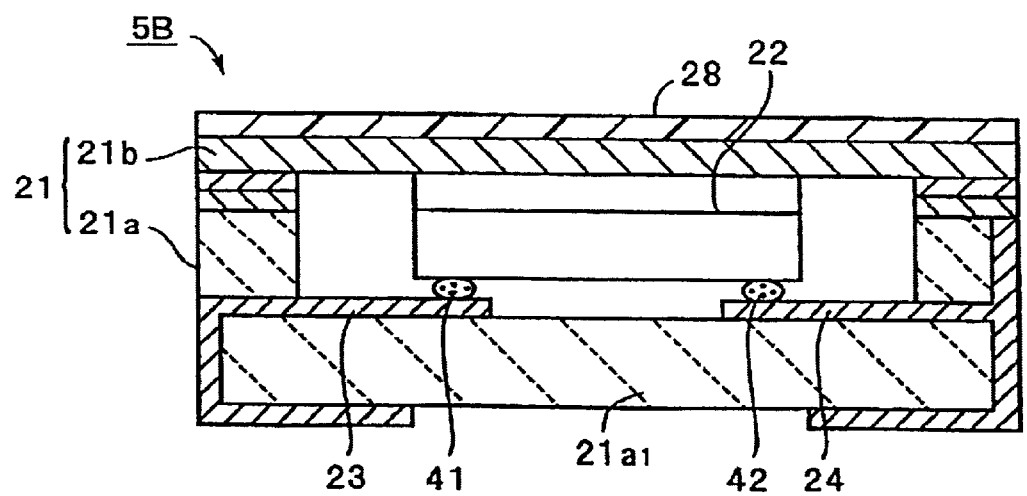
FIG. 11 is a sectional view of a surface acoustic wave device according to a second modification of the first preferred embodiment of the present invention.

FIG. 11 is a longitudinal sectional view of a second modification of the above-described preferred embodiments of the surface acoustic wave device 5.

In the surface acoustic wave device 5, the surface acoustic wave element chip 22 is electrically connected to the electrodes disposed in the first package member 21a with the bonding wires 25 and 26. In a surface acoustic wave device 5B shown in FIG. 11, the surface acoustic wave element chip 22 is mounted on the bottom plate $21a_1$ of the first package member 21a by a face-down method. Therefore, the electrode disposed in the first package member 21a is electrically connected to electrodes of the surface acoustic wave element chip 22 with bumps 41 and 42.

Figure 12:
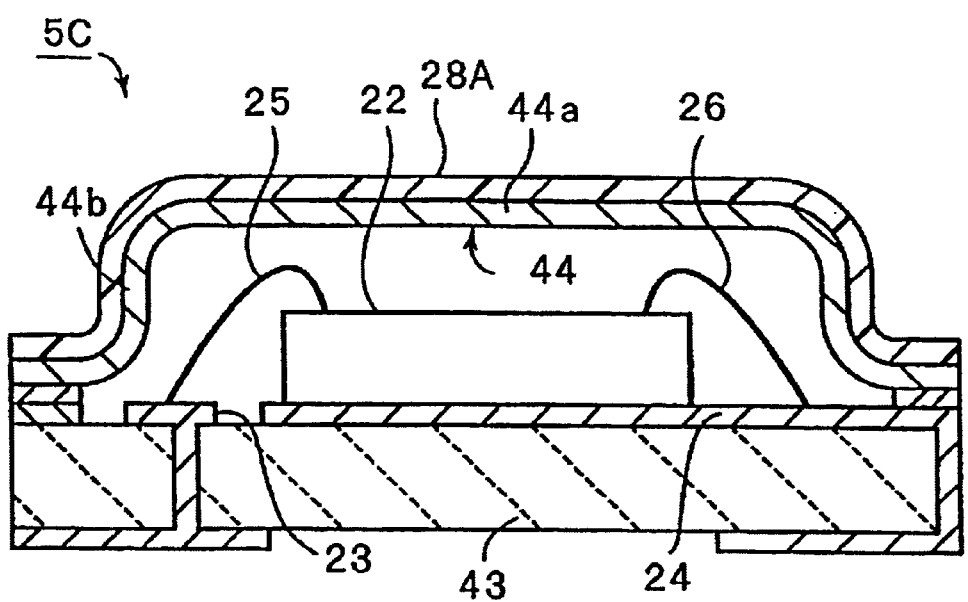
FIG. 12 is a sectional view of a surface acoustic wave device according to a third modification of the first preferred embodiment of the present invention.

FIG. 12 is a sectional view of a third modification of the above-described preferred embodiments of the surface acoustic wave device 5. In a surface acoustic wave device 5C, the package is defined by a first package member 43 and a metallic cap 44. That is, the first package member 43 includes a planar package circuit board and a second package member includes the metallic cap 44 having a top plate 44a and an annular side-wall 44b extending downwardly from the periphery of the top plate 44a.

On the top surface of the metallic cap 44, an insulating material layer 28A is provided by coating the metallic cap 44 with a resin.

As described above, the configurations of the first and second package members in the surface acoustic wave device according to the present invention are not limited, and various modifications can be made. Also, in the surface acoustic wave devices 5A to 5C shown in FIGS. 10 to 12, because on the top surface, i.e., on the portion opposing the internal surface of the metallic case 16 functioning as the electromagnetic shielding of the duplexer, the insulating plate 28a or the insulating material layer 28 or 28A is disposed, such that the electrical connection of the portion of the metallic case 16 of the duplexer opposing the electromagnetic shielding conductor of the surface acoustic wave device package is prevented as in the preferred embodiments described above.

Figure 13:
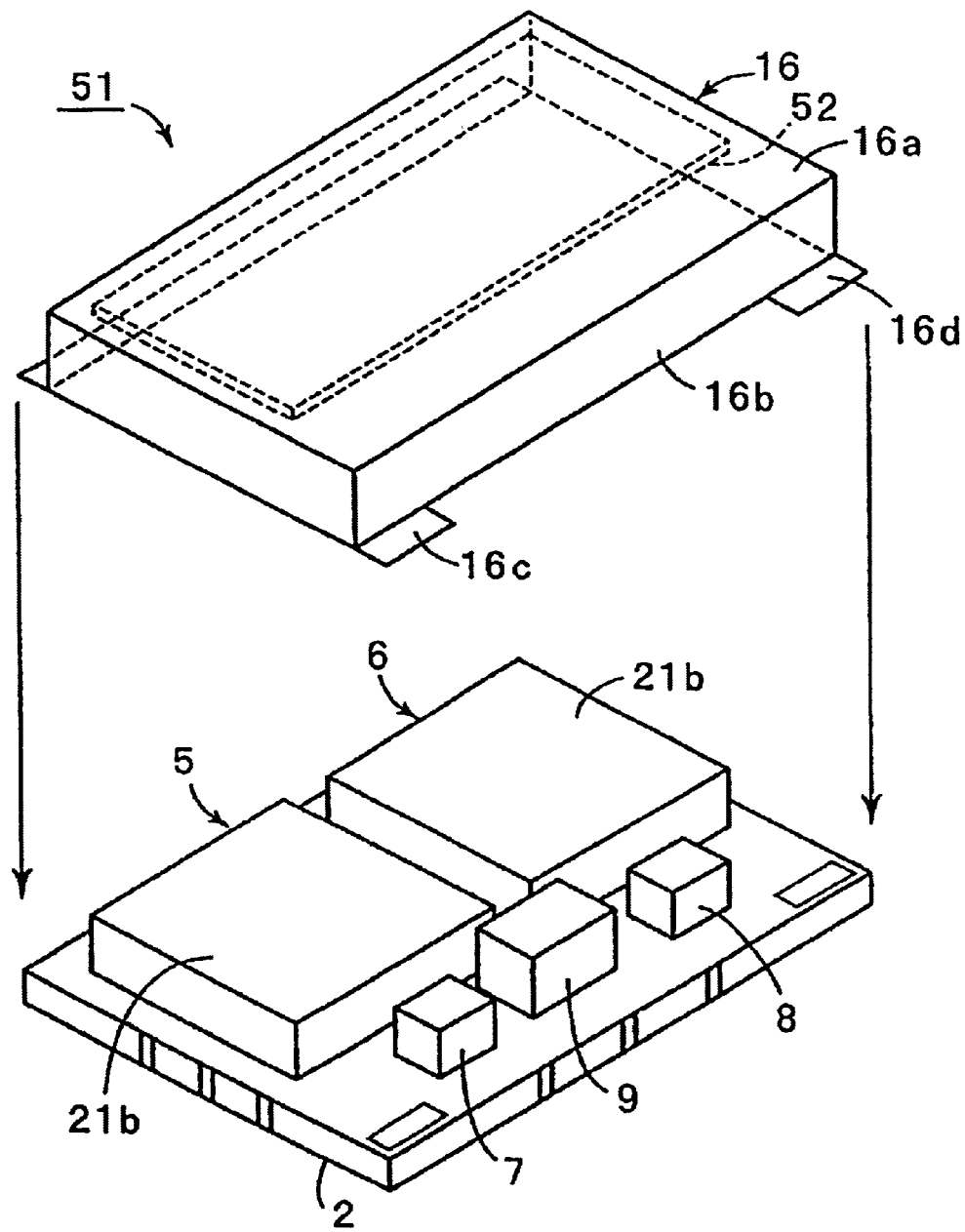
FIG. 13 is a schematic assembly view of a duplexer according to a second preferred embodiment of the present invention.

FIG. 13 is a schematic assembly view for illustrating a duplexer according to a second preferred embodiment of the present invention.

In a duplexer 51 according to the second preferred embodiment, on the top surface of the second package member of each of the surface acoustic wave devices 5 and 6, the insulating material layer 28 is not provided. Instead, an insulating material layer 52 is provided on the bottom surface of the top plate 16a of the metallic first case member 16. Since the other structures are the same as those in the first preferred embodiment, the description in the first preferred embodiment is referred to by designating like functional elements with like reference characters.

The insulating material layer 52 is preferably formed of a material similar to that of the insulating material layer 28.

The insulating material layer 52 may not be provided on the surface of the acoustic wave devices 5 and 6, as in this preferred embodiment, but on the internal surface of the top plate 16a that defines the second case member. Also, in this case, because the insulating material layer 52 is disposed in the portion functioning as the electromagnetic shielding of the surface acoustic wave devices 5 and 6, that is, the portion of the metallic case 16 that is the second case member of the duplexer opposing the lid 21b, the electrical connection between the metallic case 16 and the metallic lid 21b is prevented, thereby preventing the deterioration in frequency characteristics and isolation characteristics, similar to the first preferred embodiment.

That is, according to various preferred embodiments of the present invention, the insulating material layer may be disposed either on the surface acoustic wave device or on the case member of the composite electronic component. Furthermore, although not shown, the insulating material layer 28 according to the first preferred embodiment and the insulating material layer 52 according to the second preferred embodiment may be used in combination. That is, the insulating material layer may be provided either on the surface acoustic wave device or on the case member of the composite electronic component.

Figure 14:
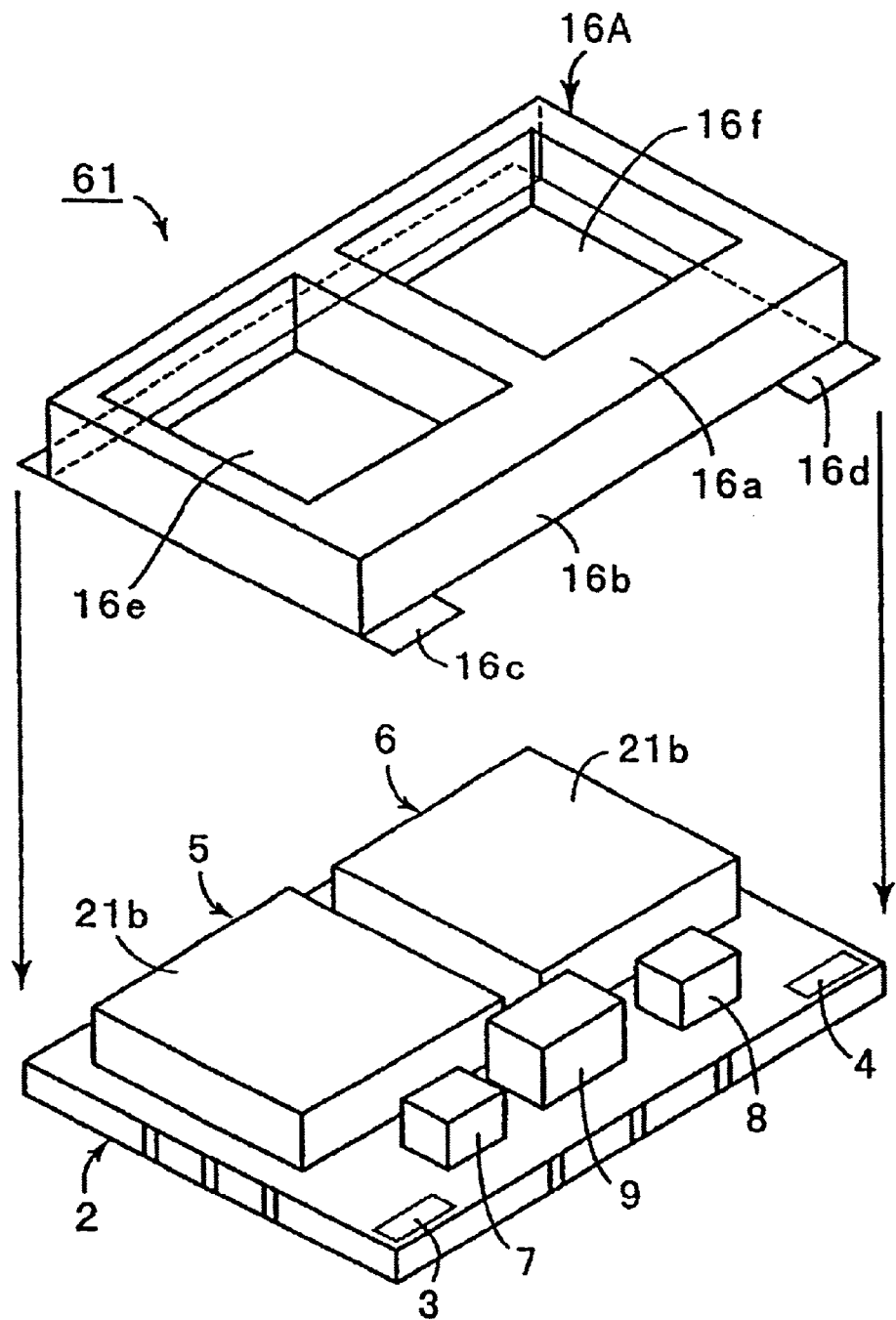
FIG. 14 is a schematic assembly view of a duplexer according to a third preferred embodiment of the present invention.
Figure 17:
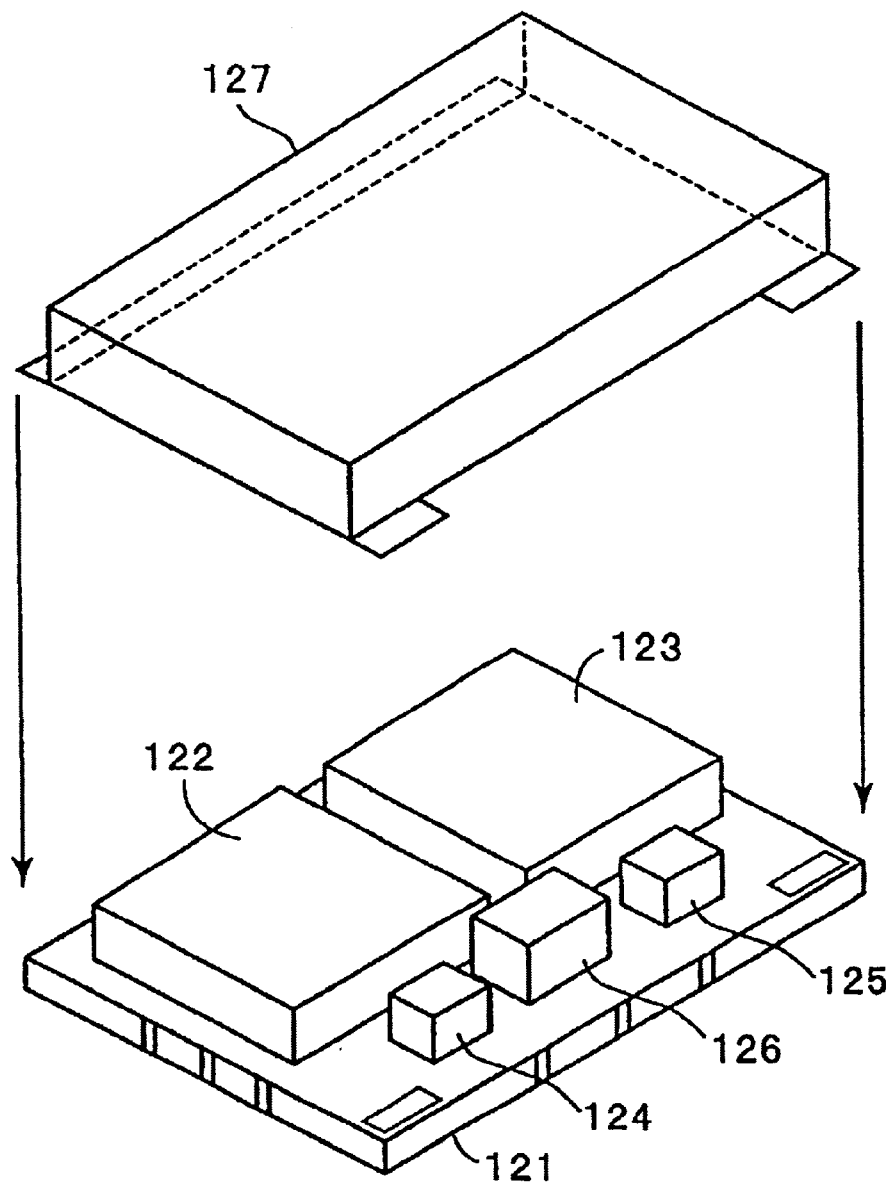
FIG. 17 is an assembly view of a duplexer as a conventional composite electronic component.
Figure 18:
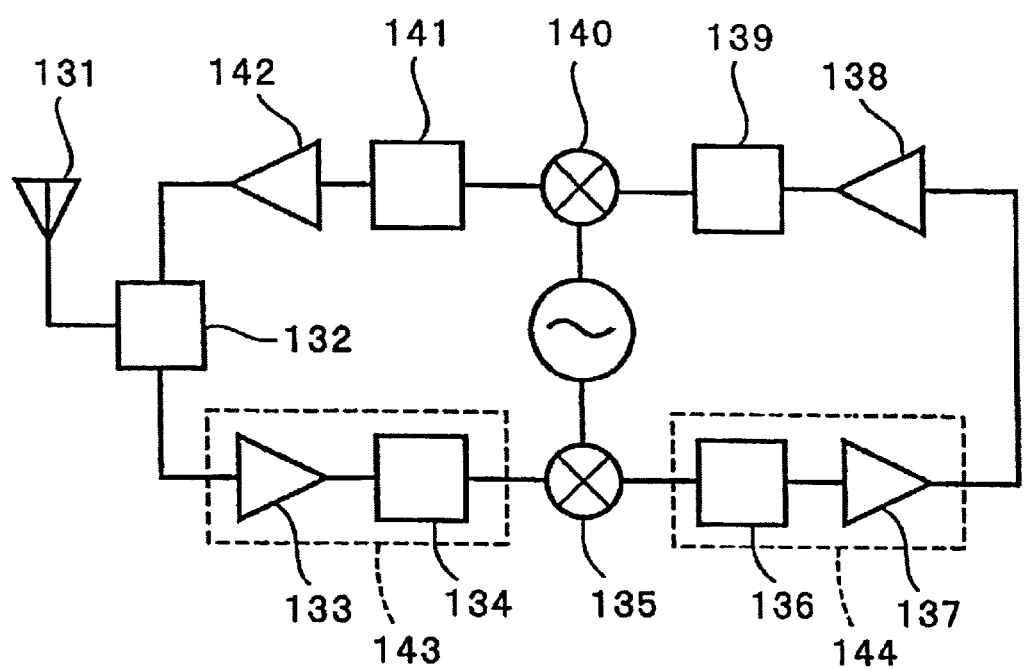
FIG. 18 is a schematic block diagram of a circuit configuration of the duplexer shown in FIG. 17.
Figure 19:
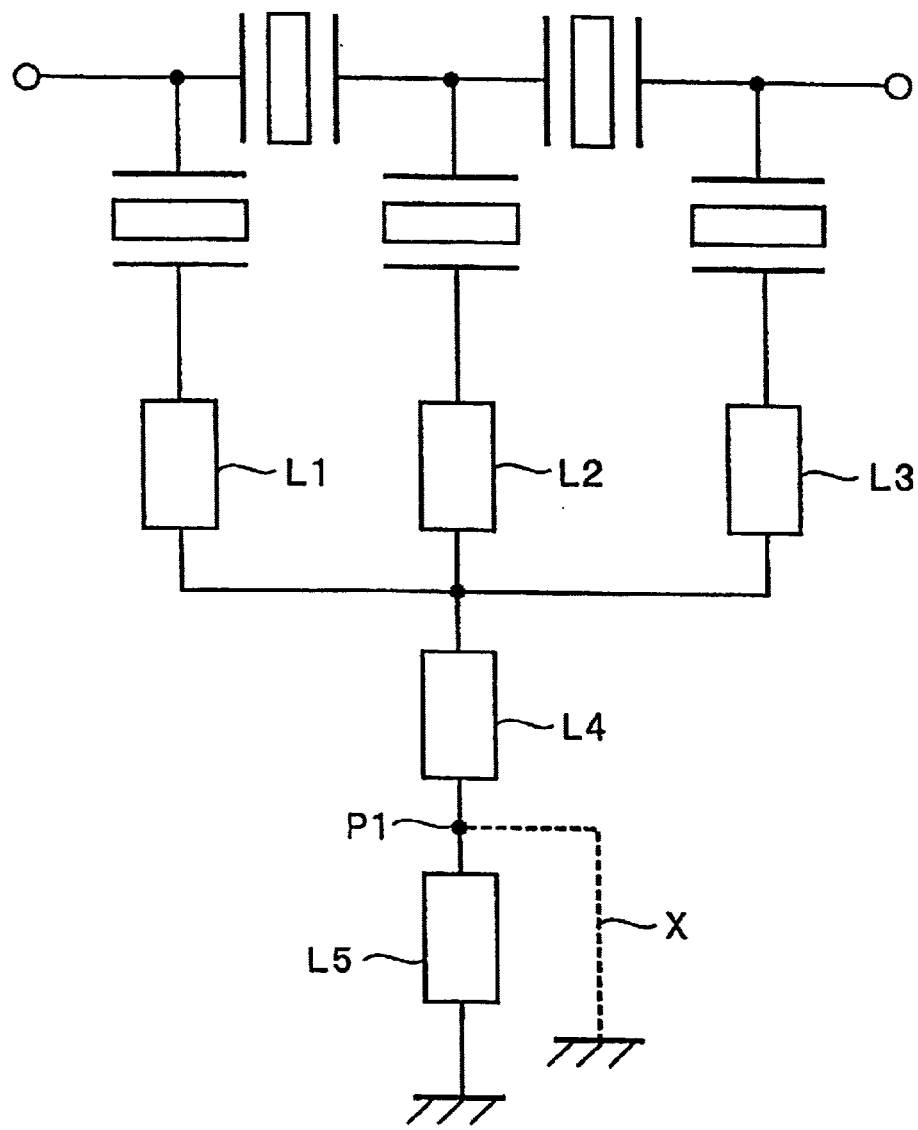
FIG. 19 is a circuit diagram for illustrating problems of the conventional duplexer.

FIG. 14 is a schematic assembly view of a duplexer as a composite electronic component according to a third preferred embodiment of the present invention. The duplexer according to the third preferred embodiment may be used instead of the duplexer 132 shown in FIG. 17, for example, thereby forming a communication device according to the present invention.

In a duplexer 61 according to the third preferred embodiment, an insulating material layer is not provided for breaking the electrical connection between a metallic case 16A and the surface acoustic wave devices 5 and 6. Instead, the top plate 16a of the metallic case 16A is provided with openings 16e and 16f provided thereon. The openings 16e and 16f have planar square shapes being positioned to oppose the lids 21b of the surface acoustic wave devices 5 and 6, respectively.

That is, according to the present preferred embodiment, over the lids 21b of the surface acoustic wave devices 5 and 6, insulating material layers including air are providing by the openings 16e and 16f, thereby preventing the electrical connection between the metallic case 16A and the lids 21b of the surface acoustic wave devices 5 and 6, similar to the first preferred embodiment. Therefore, the planar shape of each of the openings 16e and 16f has a greater area than that of the top surface of the lid 21b.

Figure 15:
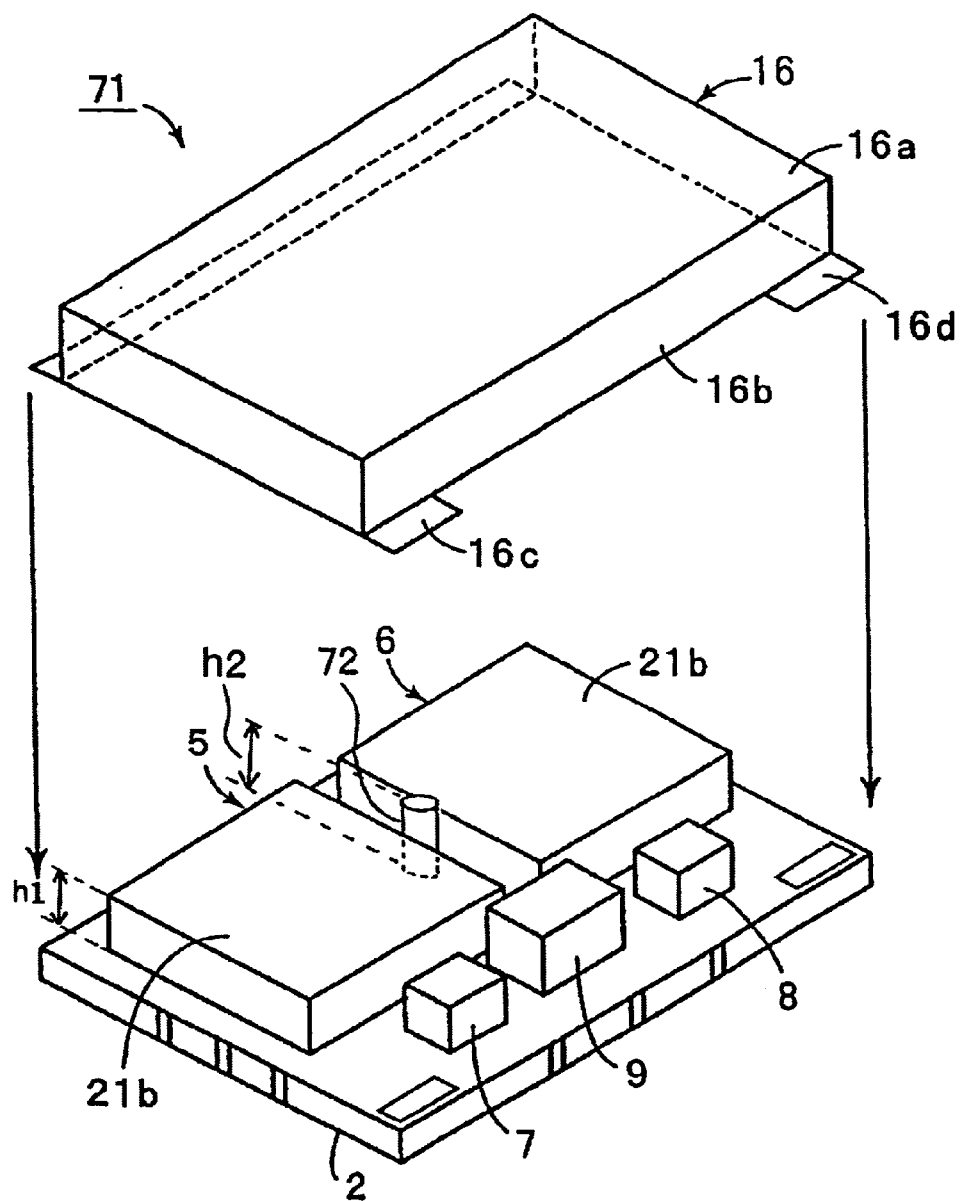
FIG. 15 is a schematic assembly view of a duplexer according to a fourth preferred embodiment of the present invention.
Figure 16:
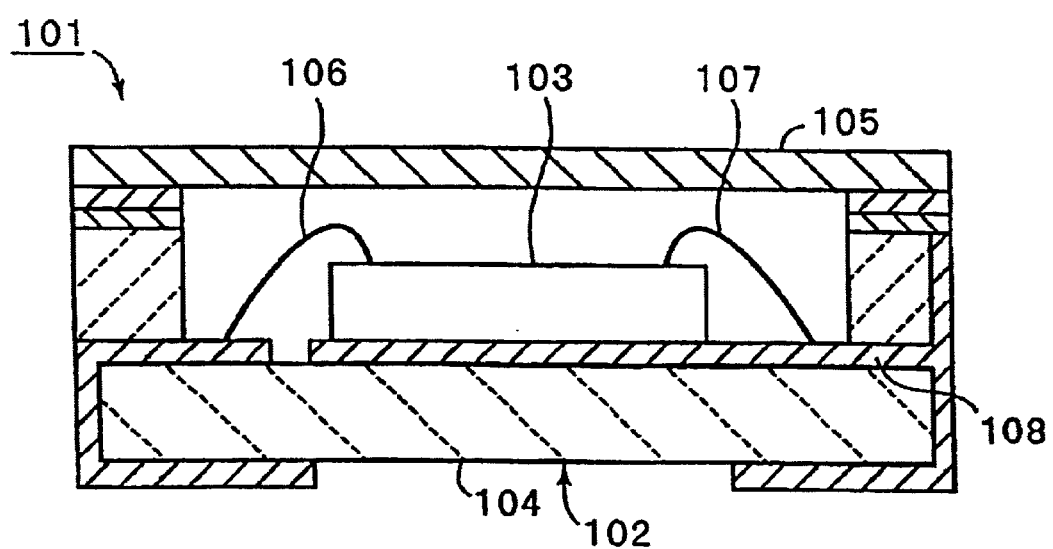
FIG. 16 is a sectional view of a conventional surface acoustic wave device.

FIG. 15 is a schematic assembly view of a duplexer that is a composite electronic component according to a fourth preferred embodiment of the present invention. The duplexer according to the third preferred embodiment may be used instead of the duplexer 132 shown in FIG. 17, for example, thereby defining a communication device according to the present invention.

In a duplexer 71 according to the fourth preferred embodiment, an insulating material layer is not provided for preventing an electrical connection between a metallic case 16A and the surface acoustic wave devices 5 and 6. Instead, a post 72 is provided on the case circuit board 2 and between the surface acoustic wave devices 5 and 6. The post 72 has a height h2 that is larger than the height h1 of the surface acoustic wave devices 5 and 6 and supports the top plate 16a of the metallic first case member 16 such that the top plate 16a is prevented from contacting the lids 21b of the surface acoustic wave devices 5 and 6. The post 72 may have a substantially circular or a substantially rectangular cross section, and even the cross section may be other shapes. Further, a plurality of posts 72 may be provided on the case circuit board 2. According to a fourth preferred embodiment, even the metallic first case member 16 may be distorted due to an external force, the post 72 prevents the metallic first case member 16 from contacting with the lids 21b of the surface acoustic wave devices 5 and 6. Thus, a composite electronic component having very stable device characteristics and high reliability is provided.

In the first and second preferred embodiments and the modifications described above, the two surface acoustic wave devices 5 and 6 are disposed in the duplexer 1. However, a composite electronic component having only one surface acoustic wave device disposed therein can be applied to the present invention. Also, three or more surface acoustic wave devices may be disposed in the composite electronic component.

Moreover, not only the duplexer but also various composite electronic components such as a multimode RF filter and a split-type RF filter in which a passing region is divided can be applied to the present invention.

In the first to fourth preferred embodiments, the first case member is preferably a planar case circuit board and the second case member is preferably defined by the metallic case 16 or 16A including the top plate and the side-wall extending downwardly from the top plate. The first case member may have a bottom plate and a side-wall extending upwardly from the bottom plate and the planar second case member may be attached to the first case member so as to close the upper opening of the first case member. In this case, the planar second case member is preferably made of a metal or an insulator having a conductive material layer provided on the external surface thereof so as to perform the function of electromagnetic shielding.

Also, in the first to fourth preferred embodiments, the metallic case 16 or 16A is provided, the first case member may be formed of an insulator such as alumina and a synthetic resin having a conductive film provided on the external surface of the insulator.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A composite electronic component comprising:
   a first case member;
   a surface acoustic wave device mounted on the first case member and which includes a package, a surface acoustic wave element accommodated within the package, and a ground terminal, the package having a conductor in at least one portion thereof; and
   a conductive second case member to be connected to a ground potential and fixed to the first case member;
   wherein at least one of the external surface of the conductor of the package and the internal surface of the second case member is provided with an insulating material layer disposed in an opposing portion between the external surface of the conductor of the package and the internal surface of the second case member; and
   the conductive second case member includes an insulator and a conductive film provided on an external surface of the insulator.

2. A component according to claim 1, wherein the insulating material layer is provided on the external surface of the conductor of the package.

3. A component according to claim 1, wherein the insulating material layer is provided on the internal surface of the second case member.

4. A component according to claim 1, wherein the first case member is a planar case circuit board and the second case member includes a top plate and an annular side-wall extending downwardly from the periphery of the top plate so as to surround the surface acoustic wave device mounted on the planar first case member.

5. A component according to claim 1, wherein the second case member is made of a metal.

6. A component according to claim 1, wherein the package includes first and second package members, the surface acoustic wave element being mounted on the first package member, the second package member having the conductor.

7. A component according to claim 6, wherein the first package member includes a bottom plate and an annular side-wall extending upwardly from the periphery of the bottom plate so as to have an opening opened upwardly and the second package member is a planar lid which is fixed so as to close the opening of the first package.

8. A component according to claim 6, wherein the first package member is a planar package circuit board and the second package member includes a top plate and side-walls extending downwardly from the periphery of the top plate so as to surround the surface acoustic wave element mounted on the planar package circuit board.

9. A component according to claim 8, wherein the second package member includes a metallic cap.

10. A component according to claim 1, wherein a plurality of the surface acoustic wave devices are mounted on the first case member.

11. A component according to claim 1, wherein the surface acoustic wave device includes a plurality of surface acoustic wave elements.

12. A component according to claim 11, wherein each of the plurality of surface acoustic wave elements has a ladder-type circuit structure including a series arm resonator and a parallel arm resonator.

13. A component according to claim 1, wherein the composite electronic component is a duplexer.

14. A communication device comprising a composite electronic component according claim 1.

15. A composite electronic component comprising:
   a first case member;
   a surface acoustic wave device mounted on the first case member and which includes a package, a surface acoustic wave element accommodated within the package, and a ground terminal, the package having a conductor in at least one portion thereof; and a conductive second case member to be connected to a ground potential and fixed to the first case member;

wherein at least one of the external surface of the conductor of the package and the internal surface of the second case member is provided with a solid insulating material layer disposed in an opposing portion between the external surface of the conductor of the package and the internal surface of the second case member.

16. A component according to claim 15, wherein the insulating material layer is provided on the external surface of the conductor of the package.

17. A component according to claim 15, wherein the insulating material layer is provided on the internal surface of the second case member.

18. A component according to claim 15, wherein the first case member is a planar case circuit board and the second case member includes a top plate and an annular side-wall extending downwardly from the periphery of the top plate so as to surround the surface acoustic wave device mounted on the planar first case member.

19. A component according to claim 15, wherein the second case member is made of a metal.

20. A component according to claim 15, wherein the second case member is made of an insulator and a conductive film provided on the external surface of the insulator.

21. A component according to claim 15, wherein the package includes first and second package members, the surface acoustic wave element being mounted on the first package member, the second package member having the conductor.

22. A component according to claim 21, wherein the first package member includes a bottom plate and an annular side-wall extending upwardly from the periphery of the bottom plate so as to have an opening opened upwardly and the second package member is a planar lid which is fixed so as to close the opening of the first package.

23. A component according to claim wherein the first package member is a planar package circuit board and the second package member includes a top plate and side-walls extending downwardly from the periphery of the top plate so as to surround the surface acoustic wave element mounted on the planar package circuit board.

24. A component according to claim 23, wherein the second package member includes a metallic cap.

25. A component according to claim 15, wherein claim 15, wherein a plurality of the surface acoustic wave devices are mounted on the first case member.

26. A component according to claim 15, wherein the surface acoustic wave device includes a plurality of surface acoustic wave elements.

27. A component according to claim 15, wherein each of the plurality of surface acoustic wave elements has a ladder-type circuit structure including a series arm resonator and a parallel arm resonator.

28. A component according to claim 15, wherein the composite electronic component is a duplexer.

29. A communication device comprising a composite electronic component according claim 15.

* * * * *